United States Patent
Bangaan et al.

(10) Patent No.: US 11,133,199 B2
(45) Date of Patent: Sep. 28, 2021

(54) MOLD HEEL CRACK PROBLEM REDUCTION

(71) Applicant: Texas Instruments Incorporated, Dallas, TX (US)

(72) Inventors: Manengway Bumal-o Bangaan, Benguet (PH); Rosil Pascual Siloy, Benguet (PH); Arvin Abellera Dela Cruz, Benguet (PH); Reynaldo Malandac Maniacup, Benguet (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/540,334

(22) Filed: Aug. 14, 2019

(65) Prior Publication Data
US 2021/0050228 A1 Feb. 18, 2021

(51) Int. Cl.
| | | |
|---|---|---|
| H01L 21/56 | (2006.01) | |
| H01L 23/31 | (2006.01) | |
| B29C 45/14 | (2006.01) | |
| B29C 45/26 | (2006.01) | |
| H01L 23/498 | (2006.01) | |
| B29L 31/34 | (2006.01) | |

(52) U.S. Cl.
CPC ...... H01L 21/565 (2013.01); B29C 45/14639 (2013.01); B29C 45/26 (2013.01); H01L 23/3128 (2013.01); H01L 23/49816 (2013.01); B29L 2031/3406 (2013.01)

(58) Field of Classification Search
CPC .............. B29C 45/14639; B29C 45/26; B29C 45/2673; H01L 23/3128; H01L 23/49816; H01L 21/565; H01L 2924/1815; H01L 21/561; H05K 2203/1316; B29L 2031/3406
See application file for complete search history.

(56) References Cited

U.S. PATENT DOCUMENTS

| | | | |
|---|---|---|---|
| 6,534,338 B1* | 3/2003 | Schoonejongen | .... H01L 21/565 257/787 |
| 2006/0138649 A1* | 6/2006 | Karnezos | ............ H01L 23/5385 257/723 |
| 2007/0262473 A1* | 11/2007 | Yim | .................... H01L 23/3128 257/787 |
| 2009/0091022 A1* | 4/2009 | Meyer | .................... H01L 21/565 257/723 |

* cited by examiner

*Primary Examiner* — Jasmine J Clark
(74) *Attorney, Agent, or Firm* — Dawn Jos; Charles A. Brill; Frank D. Cimino (57) ABSTRACT

A semiconductor package is provided which addresses problems of mold cap heel cracking. The package may made by using a cavity die and a gate insertion tool. The gate insertion tool, which fits into the cavity die, has an elongated body and includes a nozzle head with an edge which is contoured in relation to a mold cap formed on a substrate. The edge defines a curved border, for the mold cap, from a plane above the substrate to a plane lying on the substrate. The nozzle head includes a slot, for admitting a cull runner tip, centered on an axis of the elongated body.

16 Claims, 12 Drawing Sheets

MOLD HEEL CRACK PROBLEM REDUCTION

Plastic ball grid arrays (PBGAs) offer a relatively cheap, fast and efficient mechanism for mounting semiconductor chips to a printed circuit board (PCB).

Figure 1A:
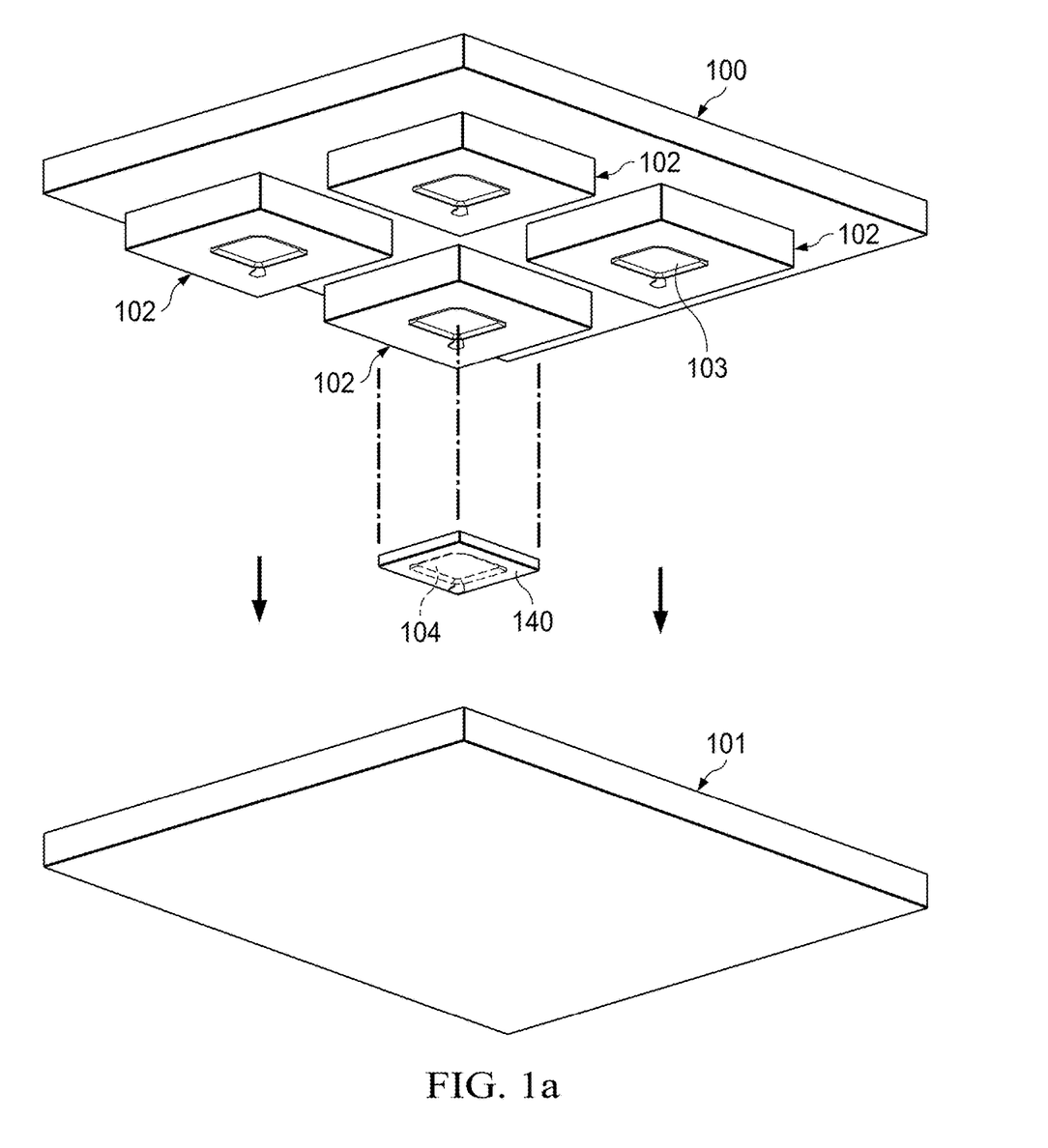
FIG. 1a illustrates a perspective drawing showing a top mold tool, a bottom mold tool and cavity die (with an exploded view).

FIG. 1a illustrates a perspective drawing showing top mold tool 100, bottom mold tool 101 and cavity die 102 (with an exploded view). Top mold tool 100, holding an array of cavity dies (each die labeled 102), is clamped onto bottom mold tool 101. Pressure is applied to the clamping, a process referred to herein as compression clamping. Each cavity die holds a semiconductor die (not shown). A semiconductor package is formed with cavity die 102, having a mold cavity 103, in connection with mold compound being heated and injected into mold cavity 103 through mold compound inlet port 104 near cavity die 102. The injected mold compound forms a mold cap (not shown). Pressurizing the mold cap facilitates the mounting of a semiconductor die (not shown) to substrate 140 in connection with fabricating a semiconductor chip (also known as a gate). The foregoing may be part of a pick and place system for mounting the semiconductor package to a PCB board. The pick and place system mechanically provides a pick and place operation for aligning the semiconductor package to contacts on the PCB board.

Figure 1B:
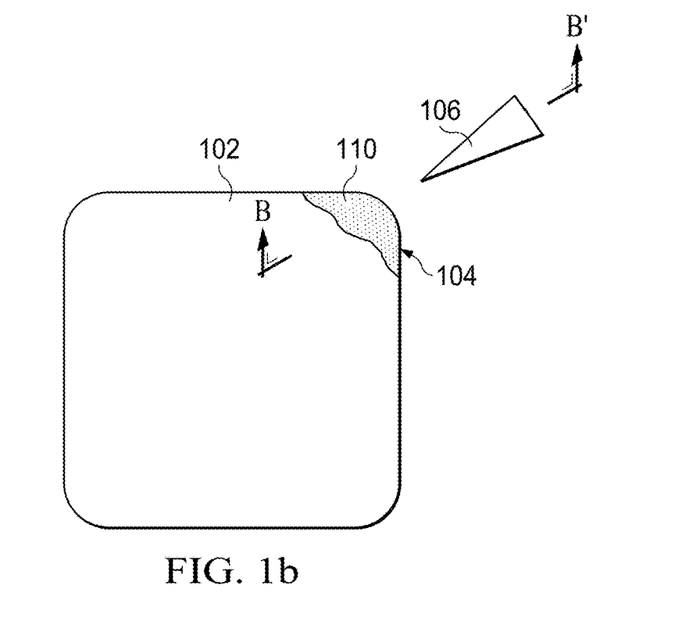
FIG. 1b is a plan view illustrating the layout of cavity die.

FIG. 1b is a plan view illustrating the layout of cavity die 102. Mold inlet port 104 provides an opening to insert cull runner tip 106 along line B-B'. Creased mold cap insert tool 108 (creased in that it forms a creased mold cap, as explained herein) may be inserted, into corner void 110 in cavity die 102, substantially perpendicular to line B-B'. Cull runner tip 106 may be inserted under creased mold cap insert tool 108 which facilitates the forming of the edge of a mold cap (not shown), the mold heel, near the injection point of mold compound into cavity die 102. Current mold cap insert tools may present a problem in facilitating mold cap formation through a discontinuity, such as a corner, at the mold heel of a resulting mold cap. This discontinuity increases susceptibility to developing cracks at the mold heel (referred to herein as mold heel cracks)—hence, the reference, creased mold cap insert tool. The high clamping pressure during molding, in combination with a steep mold gate insert design induces high stress at the substrate likely to cause a micro crack in the vicinity of a substrate. This problem is particularly troubling near the injection site of mold compound for the mold cap formation.

Figure 1C:
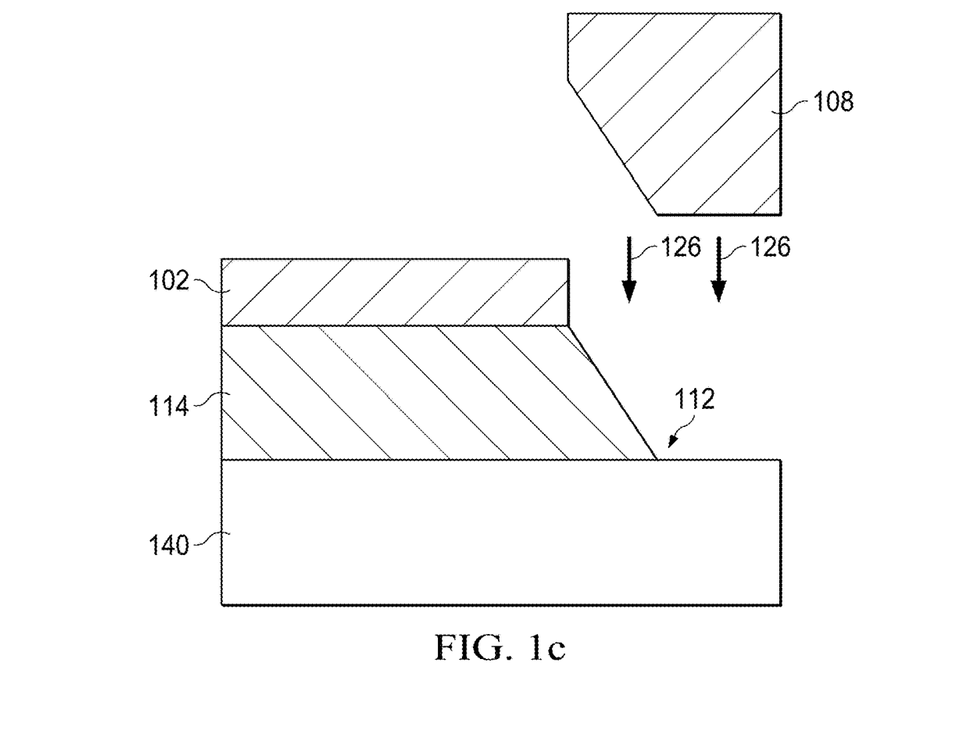
FIG. 1c illustrates a cross-sectional view of a portion of a creased mold cap over a substrate.

FIG. 1c illustrates a cross-sectional view of a portion of creased mold cap 114 over substrate 140. Cavity die 102 from top mold tool 100 lies over creased mold cap 114 and creased mold cap insert tool 108 is shown disengaged from cavity die 102. During formation of creased mold cap 114, creased mold cap insert tool 108 is placed in abutment therewith following a path for placement along arrows 126.

Figure 2:
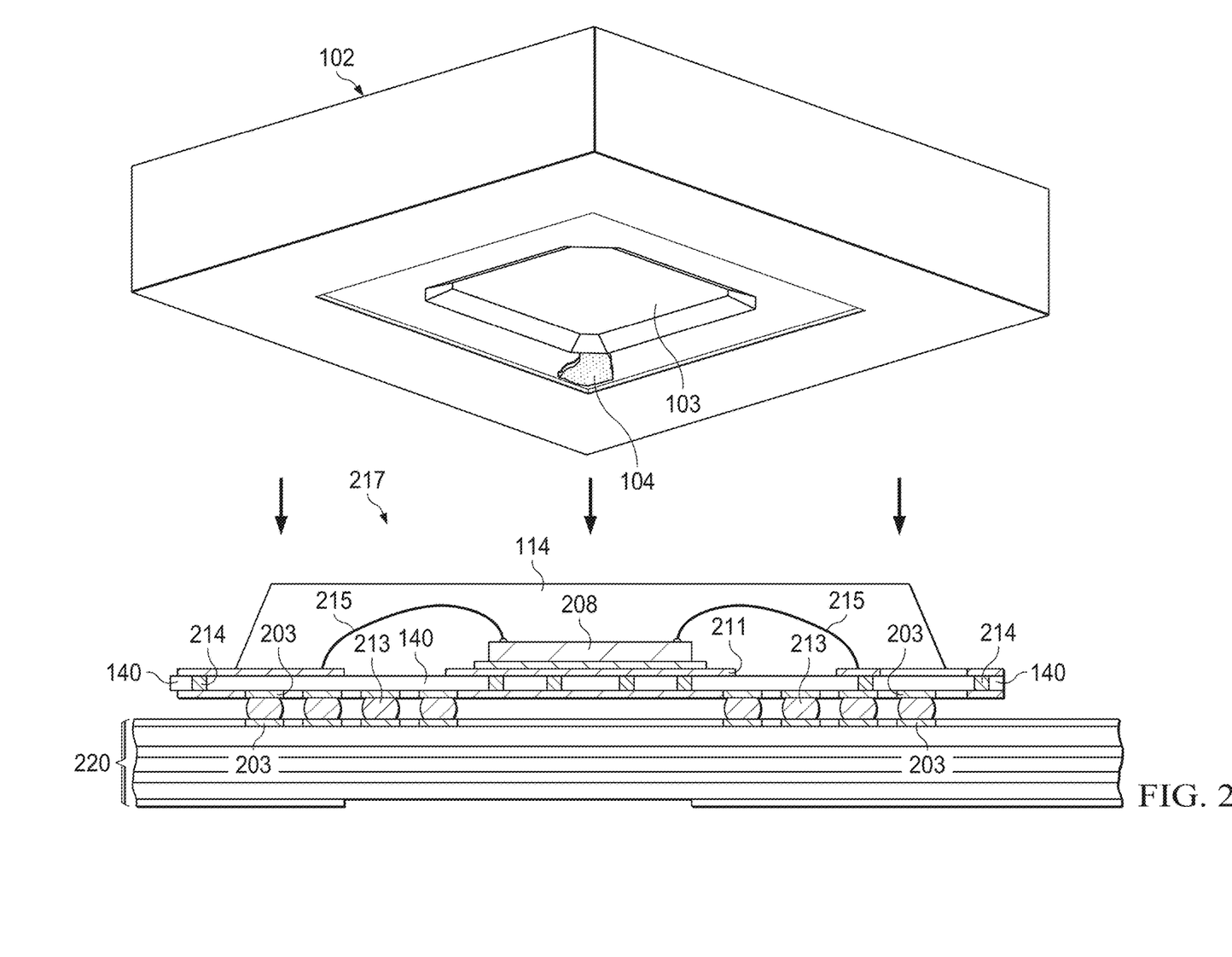
FIG. 2 is a drawing illustrating a cross-section view of a PBGA structure juxtaposed under a perspective view of its associated cavity die.

FIG. 2 is a drawing illustrating a perspective and cross-section view highlighting further aspects of the PBGA mounting process by showing the juxtaposition of cavity die 102 over a PBGA structure including creased mold cap 114 which may be made from a mold compound, such as an epoxy. Creased mold cap 114 is formed by admitting mold compound through mold inlet port 104 into mold cavity 103 in cavity die 102 and onto semiconductor die 208. Creased mold cap 114 serves as a protective covering for semiconductor die 208 and substrate 140 on which semiconductor die 208 lies. Semiconductor die 208 may be coupled to substrate 140 through conductive die attachment material 211 which may be a conductive trace. PCB 220 is connected to substrate 140 using solder balls 213. Various levels of conductive material, in PBGA package 217, may be connected by one or more vias 214. Bond wires 215 connect semiconductor die 208 to conductive pads (electrical contacts) 203 on the top surface of substrate 140. Solder balls 213 may be secured, with tacky flux, to conductive pads 203 on the bottom surface of substrate 140 of PBGA package 217. In connection with a heating process step, solder balls 213 melt causing solder to reflow and hold PBGA package 217 in alignment with PCB 220, through soldered connections between the PBGA package 217 and PCB 220. Should a mold heel crack develop, a high temperature reflow process may add more stress to PBGA package 217 causing the mold heel crack to grow and become more evident.

Figure 3A:
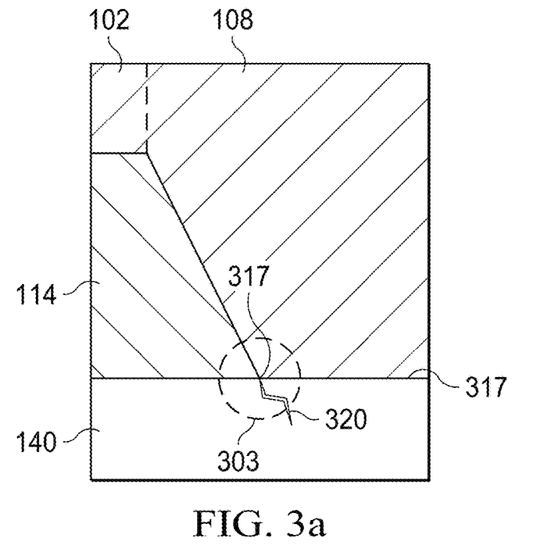
FIG. 3a illustrates a cross-sectional drawing further showing the problem which may occur with a creased mold cap at an edge.

FIG. 3a illustrates a cross-sectional drawing further showing the noted problem which may occur with creased mold cap 114 at edge 317 of creased mold cap insert tool 108. As creased mold cap 114 is formed in connection with cavity die 102, there may be a tendency for edge 317 to pinch substrate 140 causing mold heel crack 320 which may represent a crack in the epoxy overmold forming creased mold cap 114 which extends into substrate 140. More specifically, cavity die 102 causes substrate 140 to be compressed in clamping area 303. This causes mold heel crack 320 near the location of mold inlet port 104 (FIG. 2) during the formation of creased mold cap 114. With reference to FIG. 2, during the high temperature reflow process which melts solder balls 213, more stress is added to PBGA package 217. This may cause mold heel crack 320, shown in FIG. 3a, to expand and become more evident.

Figure 3B:
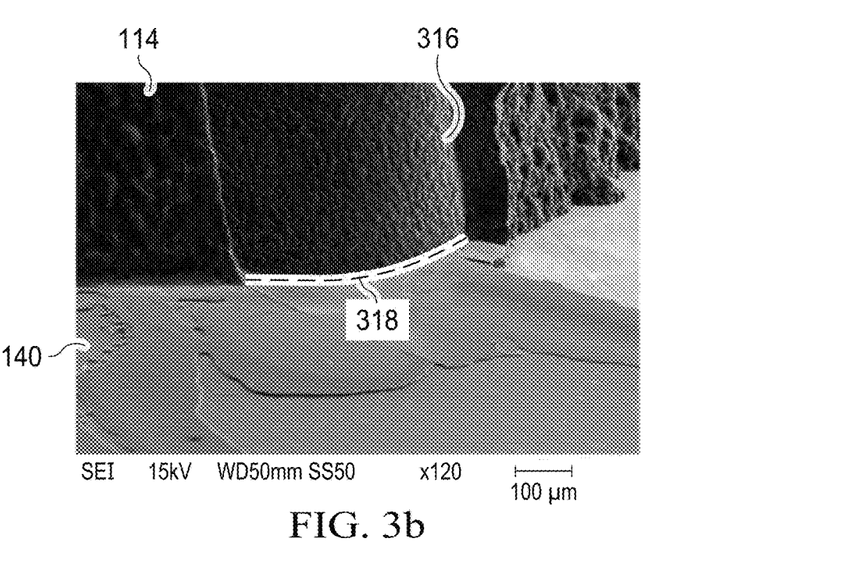
FIG. 3b illustrates a scan, from a scanning electron microscope (SEM), showing a cap mold wall a of creased mold cap and the cavity die clamping edge resulting from where a creased mold cap insert tool engages the substrate.

FIG. 3b shows a scan, from a scanning electron microscope (SEM), showing cap mold wall 316 of creased mold cap 114 and cavity die clamping edge 318 resulting from where creased mold cap insert tool 108 (FIG. 3a) meets substrate 140. Cavity die clamping edge 318 marks a likely location of the origin of mold heel crack 320 shown in FIG. 3a.

Figure 3C:
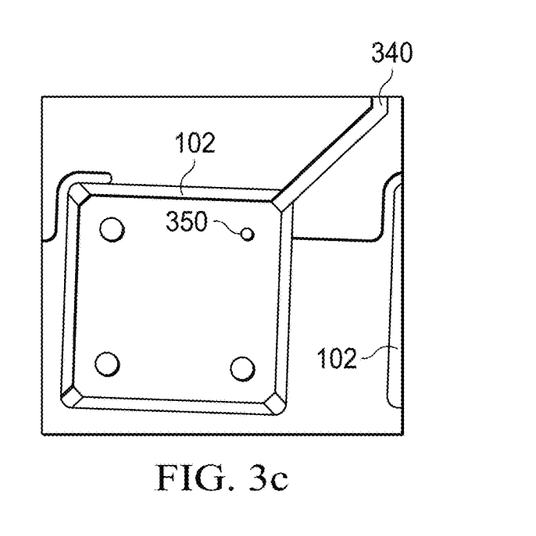
FIG. 3c illustrates a plan view showing the location of a gold gate relative a top mold tool having a mold insert port for receiving a gate insert tool during formation of a cap mold.

FIG. 3c illustrates a plan view showing the location of gold gate 340 relative top mold tool 100 having mold insert port 350 for receiving a gate insert tool 108 (FIG. 3a) during formation of a cap mold.

Figure 4:
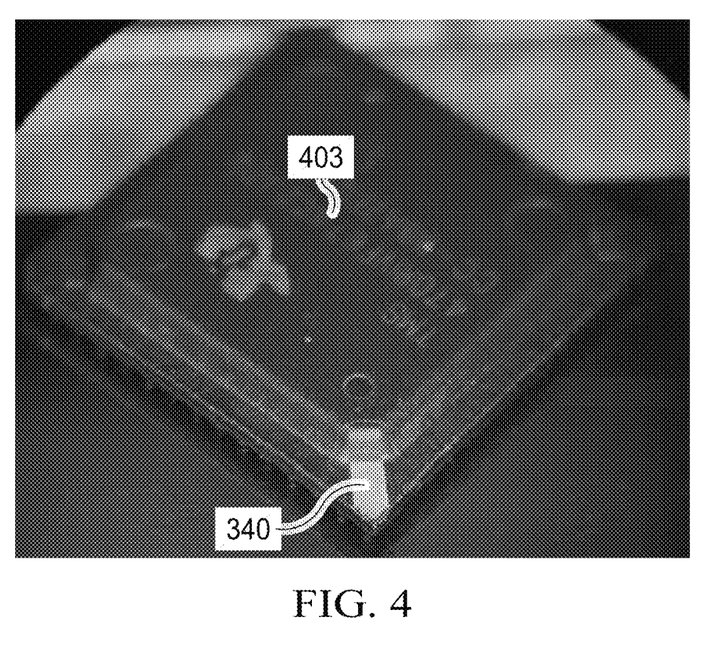
FIG. 4 illustrates SEM image showing a perspective view of a semiconductor package.

FIG. 4 illustrates SEM image showing a perspective view of semiconductor package 403. Gold gate 340 often marks the location of pin 1 on package 403 in addition to serving as the pathway of the mold compound to enter cavity die 102 (FIG. 2).

Figure 5A:
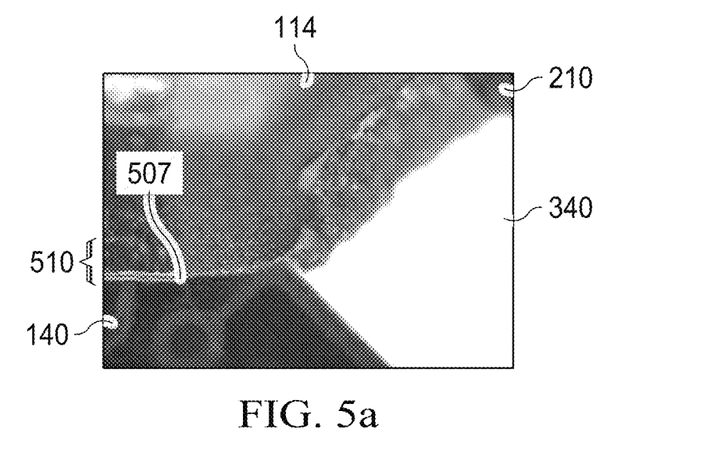
FIG. 5a illustrates a top perspective view of a creased mold cap, near a gold gate, having a sharp edge with respect to a substrate.
Figure 5B:
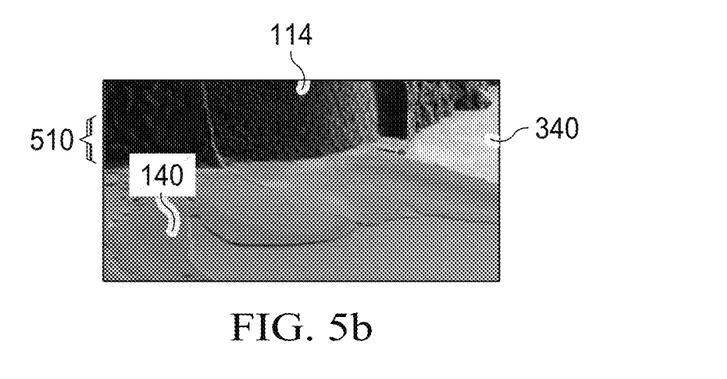
FIG. 5b illustrates a raised elevation view of a creased mold cap having a sharp edge which may likely result in a mold heel crack, in a mold heel, which lies on either side of a gold gate.
Figure 5C:
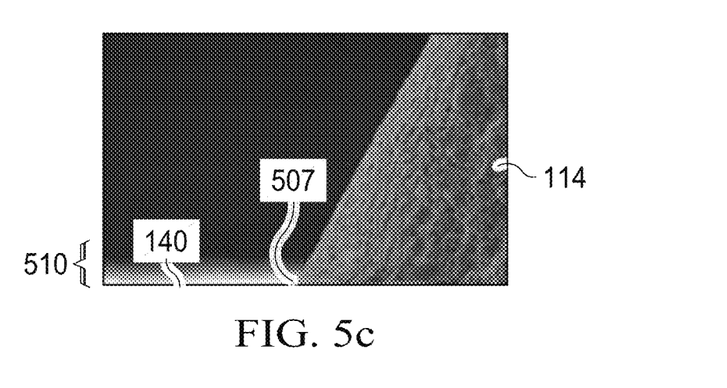
FIG. 5c illustrates a side view of creased mold cap clearly showing a sharp edge which may result in a mold heel crack in a mold heel.

FIGS. 5a-5c illustrate SEM images of different views of creased mold cap 114 in relation to substrate 140, sharp edge 507 in creased mold cap 114 and mold heel 510.

FIG. 5a illustrates a top perspective view of creased mold cap 114, near gold gate 401, having sharp edge 507, lying on either of gold gate 340, with respect to substrate 140. Sharp edge 507 is shown which, as noted herein, may cause much stress sufficient to result in a mold heel crack, which may extend into substrate 140, in mold heel 510.

FIG. 5b illustrates a raised elevation view of creased mold cap 114 having sharp edge 507 which may likely result in a mold heel crack, in mold heel 510, which lies on either side of gold gate 340 (only one side shown).

FIG. 5c illustrates a side view of creased mold cap 114 clearly showing sharp edge 507 which may result in a mold heel crack in mold heel 510.

Based on the foregoing, there is a need in the art to minimize the occurrence of mold heel cracks.

SUMMARY

A semiconductor package is disclosed which has a substrate having a top surface, a bottom surface, wherein a plurality of conductive traces are formed on the top surface, a plurality of electrical contacts are formed on the bottom surface, and a plurality of vias are formed in the substrate to electrically connect the plurality of conductive traces and electrical contacts. A semiconductor die attached to the top surface. Additionally, a mold cap is provided which approximates an inverted Sigmoid function curve shape, in two dimensions, so as to present a smoothed, beveled edge, formed on the top surface to at least cover the conductive traces and the semiconductor die.

In one example, a system is provided for making a semiconductor package having a cavity die and a gate insertion tool. The gate insertion tool fits into the cavity die which has an elongated body and includes a nozzle head with an edge which is contoured in relation to a mold cap formed on a substrate within the cavity. The edge defines a curved border, for the mold cap, from a first plane above the substrate to a second plane lying on the substrate. The nozzle head includes a slot, for admitting a cull runner, substantially centered on an axis of the elongated body.

In some examples, the mold tool die includes a recess approximately outlining an inverted Sigmoid function curve shape, in two dimensions, so as to present a smoothed, beveled edge at the end of the elongated body.

The foregoing, and other features and advantages, will be apparent from the following, more particular description of examples, the accompanying drawings, and the claims.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows:

FIG. 7b illustrates a perspective view of a nozzle head, magnifying a portion of FIG. 7a.

Applicable reference numerals have been carried forward.

DETAILED DESCRIPTION

A solution to mold heel cracks made by a cavity die lies in eliminating the sharp corner which may exist on either side of a gold gate. The sharp corners may be eliminated in connection with inserting a gate insert tool having a profile that will contour the edge of a mold cap. By smoothing the mold heel of a mold cap, a mold heel crack has a much less likely chance of occurring, especially in connection with a high temperature reflow process for the solder balls of the semiconductor package.

Figure 6A:
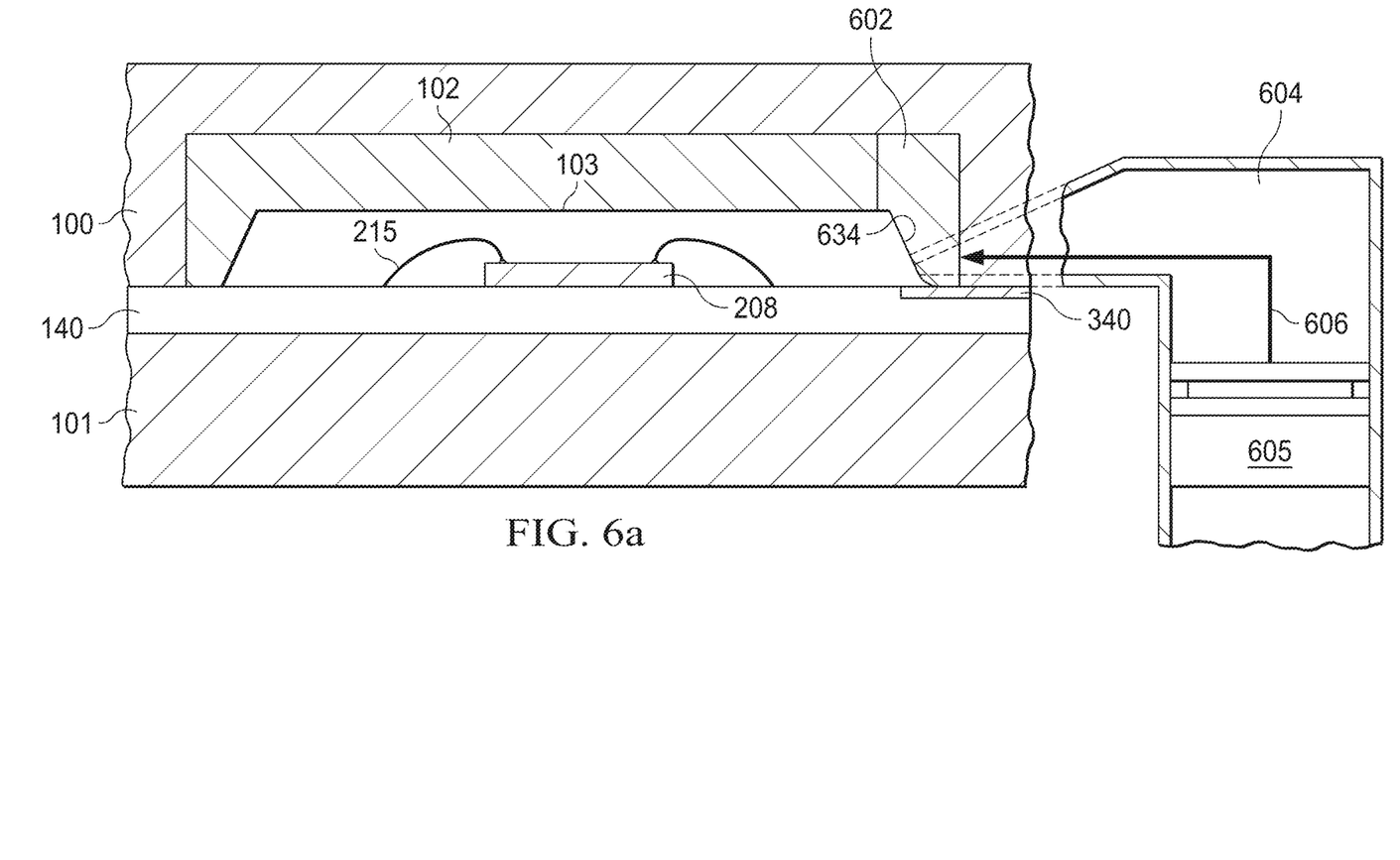
FIG. 6a illustrates a cross-sectional view of system elements for forming a mold cap over a gate.

FIG. 6a illustrates a cross-sectional view of system elements for forming a mold cap over a gate. Gate insert tool 602 is shown in-place abutting an outer edge of cavity die 102 from an array of dies (not shown) coupled to top mold tool 100. Cull runner insert 603, of cull runner 604, fits between gold gate 340 and gate insert tool 602 while gate insert tool 602 is in-place against cavity die 102. Mold compound (not shown) may be pumped, using plunger 605, along path 606 through cull runner 604, into cavity 103 lying within cavity die 102 and bordered by bottom mold tool 101.

Figure 6B:
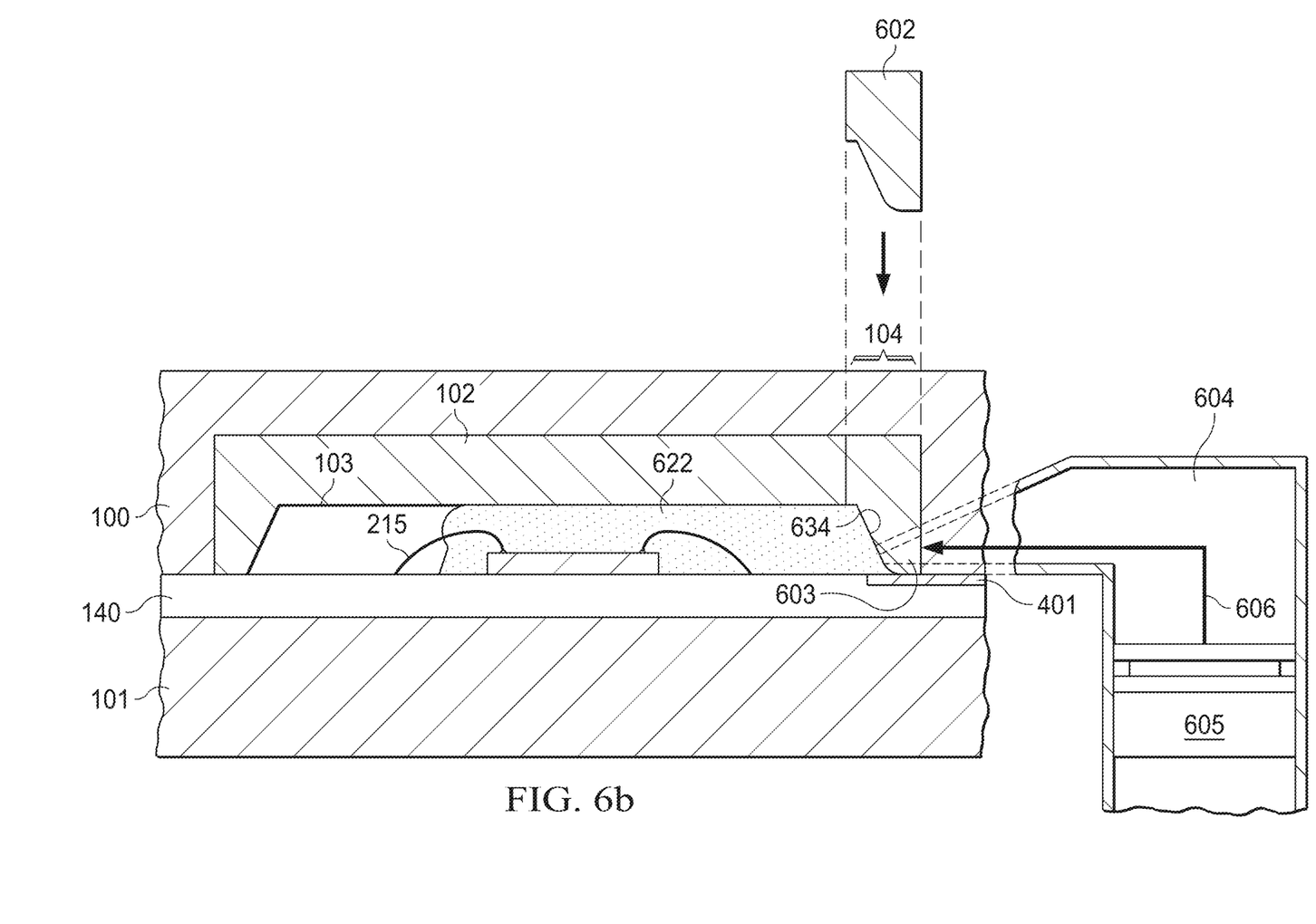
FIG. 6b illustrates a cross-sectional view of the system for forming a mold cap over a gate, as shown in FIG. 6a, along with a mold compound which has been injected into (and filling a portion of) cavity.

FIG. 6b illustrates the side view of the system for forming a mold cap over a gate, as shown in FIG. 6a, along with mold compound 622 within (and filling a portion of) cavity 103. Gate insert tool 602 removably abuts cavity die 102.

Figure 7A:
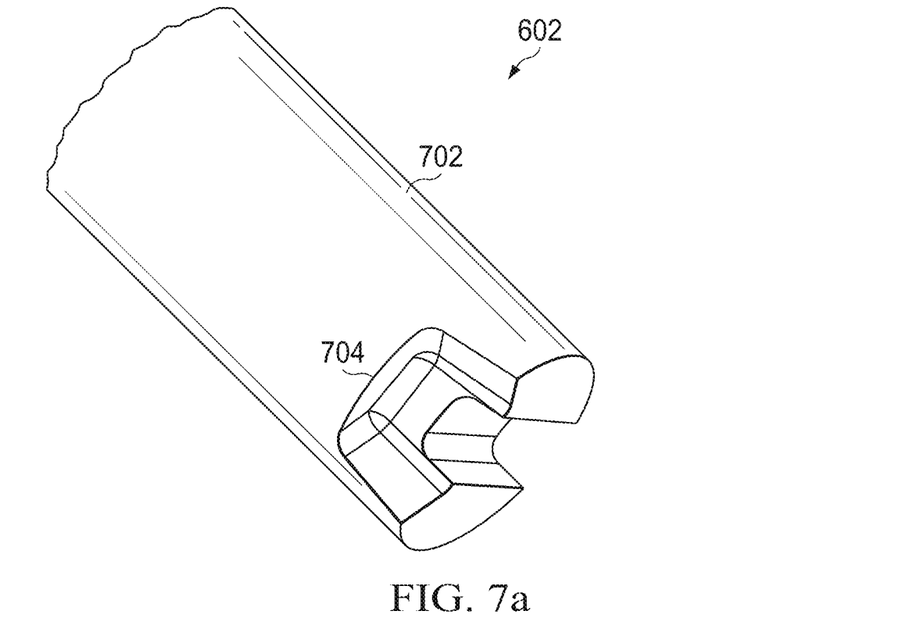
FIG. 7a illustrates a perspective view of gate insert tool which provides a mold cap of the desired profile according to the foregoing.

FIG. 7a illustrates a perspective view of gate insert tool 602 which provides a mold cap of the desired profile according to the foregoing. Gate insert tool 602 includes nozzle head 702 having a chamfered contour 704.

Figure 7B:
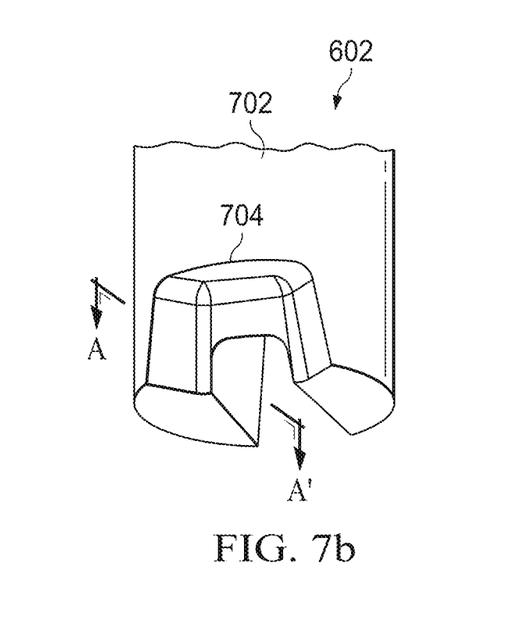

FIG. 7b illustrates a perspective view of nozzle head 702, magnifying a portion of FIG. 7a. Cull runner insert 603, as shown in FIG. 6b, may be inserted into nozzle head 702 along line A-A'.

Figure 7C:
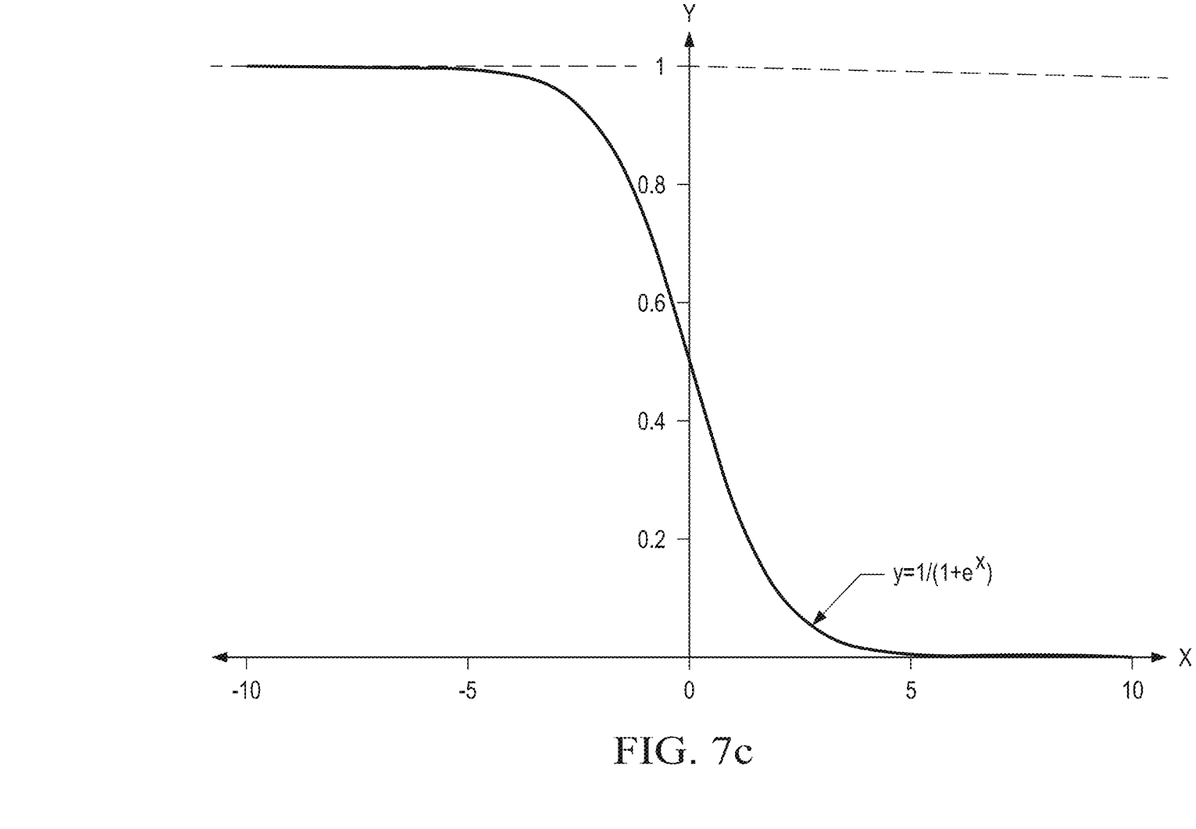
FIG. 7c illustrates a graph of an inverted Sigmoid function according to the equation $y=1/(1+e^x)$.

FIG. 7c illustrates a graph of an inverted Sigmoid function according to the equation $y=1/(1+e^x)$. The shape of the inverted Sigmoid function provides one smoothed contour outlining the shape produced by chamfered contour 704 that will produce a mold cap of a suitable profile which is less prone to mold heel cracks.

Figure 8A:
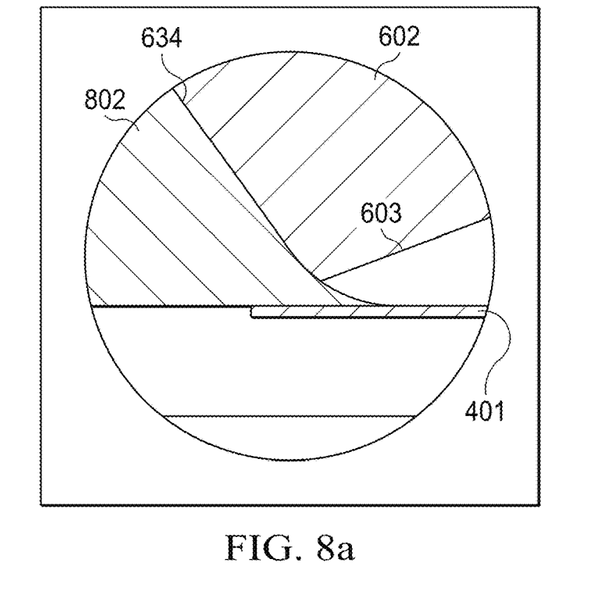
FIG. 8a illustrates a cross-sectional view of a magnified portion of FIG. 6b.
Figure 8B:
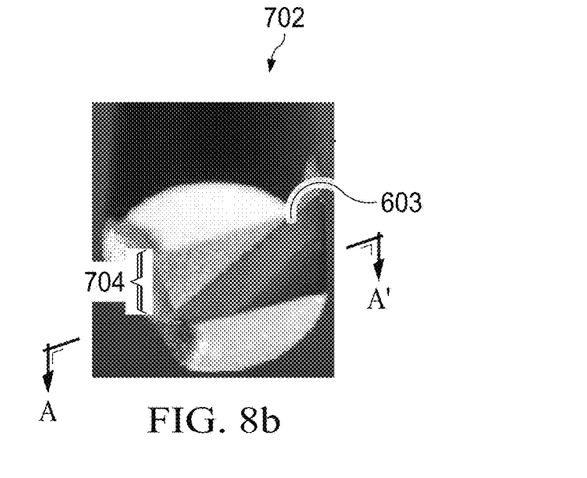
FIG. 8b illustrates an elevated perspective view of mold cap with mold cap edge having a chamfered contour.
Figure 8C:
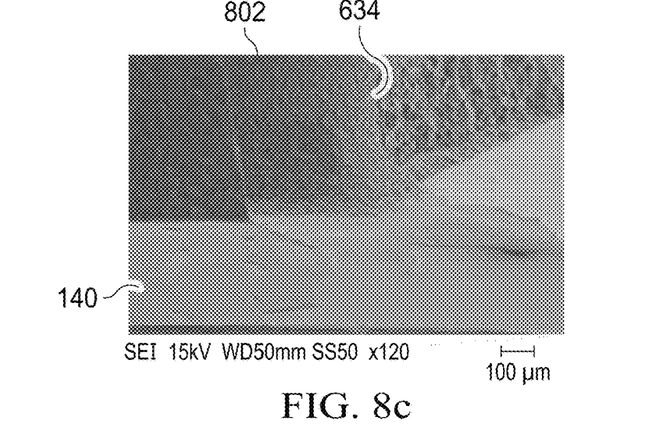
FIG. 8c illustrates an SEM image of an elevated cross-sectional view of a gate insert tool from a direction from a cull runner insert toward a gold gate (as shown in FIG. 8a).

FIGS. 8a through 8c provide additional views of the gate insert tool and the resulting mold cap according to the foregoing.

FIG. 8a illustrates a magnified portion of FIG. 6b. Mold cap edge 634 presents a chamfered contour which outlines the shape of an inverted Sigmoid function on mold cap 802. Likewise, gate insert tool 602 which abuts mold cap edge 634, produces mold cap edge 634 which approximately outlines the shape of an inverted Sigmoid function.

FIG. 8b illustrates an SEM image of an elevated cross-sectional view an example of gate insert tool 602. Cull runner insert 603 is shown inserted into nozzle head 702 along line A-A'.

FIG. 8c illustrates a SEM image showing a perspective view of mold cap 802 having mold cap edge 634 which approximately outlines the shape of an inverted Sigmoid function.

Gate insert tool 602, as shown in the foregoing drawing figures, may be used to engage an epoxy overmold overlying a die, and collapse solder balls 213 (as shown in FIG. 2) in connection with pressure applied by top mold tool 100 during solder reflow to join each PBGA 217 to PCB 120 (FIG. 2). As shown in FIG. 8a, the contoured edge of gate insert tool 602 helps ensure stress-reduced corners around mold cap 802, which may be made of an epoxy overmold.

Figure 9:
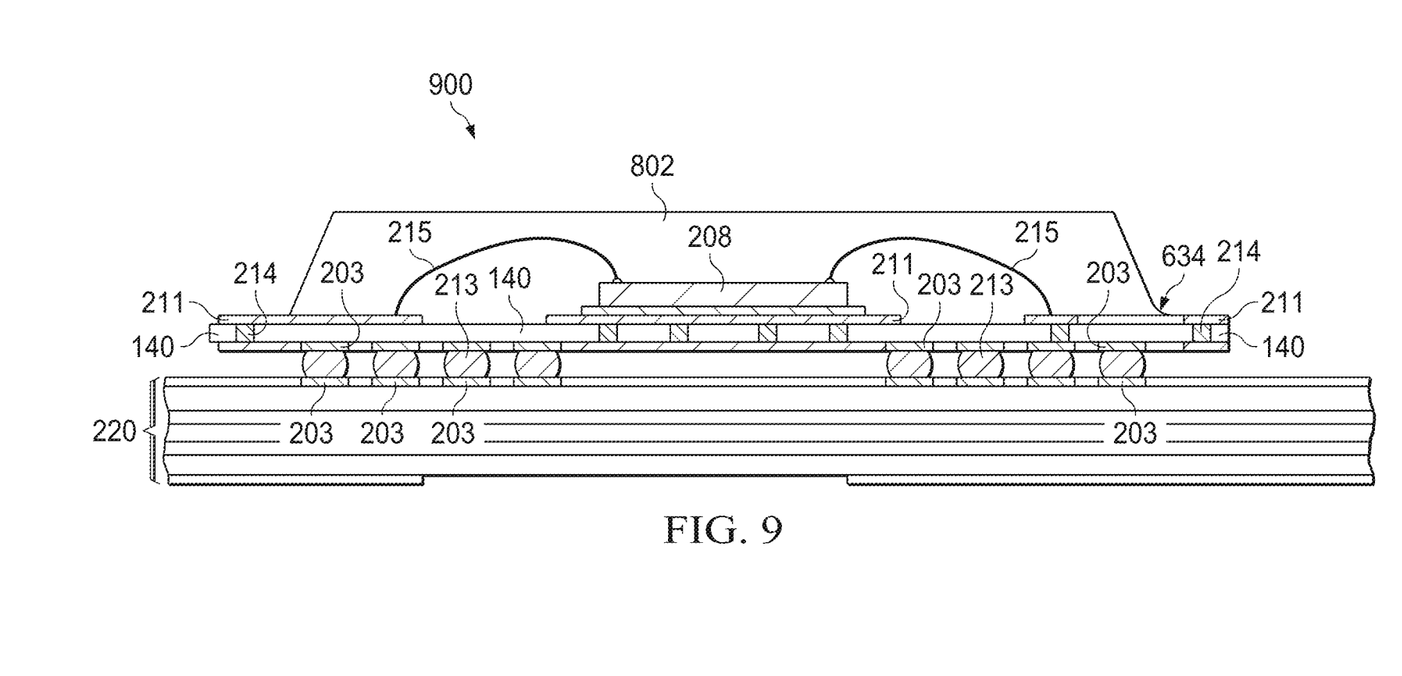
FIG. 9 illustrates a cross-sectional view of a PBGA structure as described herein.

FIG. 9 illustrates a cross-sectional view of a PBGA structure 900 according to the foregoing. Mold cap edge 634, of mold cap 802, is shown which approximately outlines the shape of an inverted Sigmoid function.

Once the mold cap has been formed on each cavity die 102 (as shown in FIG. 1) according to the gate insert tool disclosed herein, a pick and place machine (not shown) may be used to mount a semiconductor package to a PCB. Pick and place machines ensure component body alignment, component solder ball alignment; and allow inspection of solder balls before placement. Alignment inspections may be done from the top of the PBGA package with the gold gate being used to mark the position of pin 1 of the semiconductor device and to ensure that the PBGA package is aligned with its proper position on the PC board.

PBGA pick and place systems may include a computer vision system that recognizes and positions the component and a mechanical system which physically performs the pick and place operation. The PBGAs may be self-aligning during solder reflow. The computer vision system may be used to recognize and specify positioning of the PBGA package on the PCB.

The foregoing has been described herein using specific embodiments for the purposes of illustration only. It will be readily apparent to one of ordinary skill in the art, however, that the principles herein can be embodied in other ways. Therefore, the foregoing should not be regarded as being limited in scope to the specific embodiments disclosed herein, but instead, as being fully commensurate in scope with the following claims.

I claim:

1. A semiconductor package, comprising:
   a substrate;
   a semiconductor die attached to, and electrically connected to the substrate; and
   a mold compound covering the semiconductor die; the mold compound contacting the substrate at an edge of the mold compound, wherein the edge includes a shape of an inverted Sigmoid function curve in a cross-sectional view of the semiconductor package.

2. The semiconductor package of claim 1, wherein the substrate includes a plurality of conductive traces on a top surface, and a plurality of electrical contacts on a bottom surface.

3. The semiconductor package of claim 2, wherein the plurality of electrical contacts is attached to a printed circuit board.

4. The semiconductor package of claim 1, wherein the semiconductor package is a plastic ball grid array (PBGA) package.

5. The semiconductor package of claim 1, wherein the semiconductor die is electrically connected to the substrate via a wire bond.

6. The semiconductor package of claim 1, wherein the edge is a contoured edge in the cross-sectional view of the semiconductor package.

7. A semiconductor package, comprising:
   a substrate;
   a semiconductor die attached to, and electrically connected to the substrate; and
   a mold compound covering the semiconductor die; the mold compound including a chamfered side from a cross-sectional view of the semiconductor package, wherein an end of the chamfered side substantially including a shape according to a function $y=1/(1+e^x)$, wherein y is along a height of the mold compound from the cross-sectional view, and x is along a length of the mold compound in the cross-sectional view.

8. The semiconductor package of claim 7, wherein the shape includes an inverted Sigmoid function curve.

9. The semiconductor package of claim 7, wherein the end of the chamfered side is closer to the substrate than a top surface of the mold compound.

10. The semiconductor package of claim 7, wherein the substrate includes a plurality of conductive traces on a top surface, and a plurality of electrical contacts on a bottom surface.

11. The semiconductor package of claim 10, wherein the plurality of electrical contacts is attached to a printed circuit board.

12. The semiconductor package of claim 7, wherein the semiconductor package is a plastic ball grid array (PBGA) package.

13. The semiconductor package of claim 7, wherein the semiconductor die is electrically connected to the substrate via a wire bond.

14. The semiconductor package of claim 7, wherein the end is a contoured end from the cross-sectional view of the semiconductor package.

15. The semiconductor package of claim 7, wherein the end includes a beveled from in the cross-sectional view of the semiconductor package.

16. The semiconductor package of claim 7, wherein the cross-sectional view of the semiconductor package is a cross-sectional side view of the semiconductor package.

* * * * *